US010914796B2

(12) United States Patent
Mohan et al.

(10) Patent No.: US 10,914,796 B2
(45) Date of Patent: Feb. 9, 2021

(54) INTEGRATED FLUXGATE DEVICE WITH THREE-DIMENSIONAL SENSING

(71) Applicant: Texas Instruments Incorporated, Dallas, TX (US)

(72) Inventors: Anuraag Mohan, Fremont, CA (US); William David French, San Jose, CA (US); Ubol Udompanyavit, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 570 days.

(21) Appl. No.: 15/016,507

(22) Filed: Feb. 5, 2016

(65) Prior Publication Data

US 2017/0229639 A1    Aug. 10, 2017

(51) Int. Cl.
| | | |
|---|---|---|
| *G01R 33/04* | (2006.01) | |
| *G01R 33/02* | (2006.01) | |
| *H01L 43/00* | (2006.01) | |
| *H01L 43/08* | (2006.01) | |
| *H01L 25/04* | (2014.01) | |

(52) U.S. Cl.
CPC ......... *G01R 33/04* (2013.01); *G01R 33/0206* (2013.01); *H01L 25/04* (2013.01); *H01L 43/00* (2013.01); *H01L 43/08* (2013.01)

(58) Field of Classification Search
CPC ..... H01L 43/00; H01L 43/08; G01R 33/0206; G01R 33/04
USPC .................................................. 257/421, 427
See application file for complete search history.

(56) References Cited

U.S. PATENT DOCUMENTS

| | | | | |
|---|---|---|---|---|
| 5,850,624 A | * | 12/1998 | Gard ................... | G01R 33/0206 33/356 |
| 2002/0056202 A1 | | 5/2002 | Tamura | |
| 2005/0072011 A1 | | 4/2005 | Miyanshita et al. | |
| 2007/0222441 A1 | * | 9/2007 | Satoh ................. | G01R 33/0206 324/253 |
| 2009/0243609 A1 | * | 10/2009 | Hasunuma ............ | G01R 33/05 324/253 |

(Continued)

FOREIGN PATENT DOCUMENTS

| | | |
|---|---|---|
| EP | 1441234 A2 | 7/2004 |
| EP | 2116858 | 11/2009 |

(Continued)

OTHER PUBLICATIONS

Notification of Transmittal of the International Search Report and the Written Opinion of the International Searching Authority, or the Declaration, dated May 18, 2017.

*Primary Examiner* — Matthew E Warren
(74) *Attorney, Agent, or Firm* — Ronald O. Neerings; Charles A. Brill; Frank D. Cimino (57) ABSTRACT

An electromagnetic sensing device with a package substrate, a first die mounted on the package substrate, and a second die mounted on the package substrate. The first die includes a first integrated circuit and a first magnetic core formed above the first integrated circuit. The first magnetic core has a first sensing axis parallel to a planar surface of the package substrate. The second die includes a second integrated circuit and a second magnetic core formed above the second integrated circuit. The second magnetic core has a second sensing axis orthogonal to the planar surface of the package substrate.

52 Claims, 4 Drawing Sheets

(56) References Cited

U.S. PATENT DOCUMENTS

| | | | |
|---|---|---|---|
| 2009/0278533 A1* | 11/2009 | Chang | G01R 33/0206 324/247 |
| 2012/0151786 A1* | 6/2012 | Ohmori | G01C 17/30 33/361 |
| 2013/0049749 A1* | 2/2013 | Mohan | G01R 33/04 324/252 |
| 2014/0218018 A1 | 8/2014 | Ivanov et al. | |
| 2015/0048820 A1 | 2/2015 | Schaffer et al. | |

FOREIGN PATENT DOCUMENTS

| | | |
|---|---|---|
| JP | 2004271481 | 9/2004 |
| JP | 2006214776 | 8/2006 |
| KR | 20060038511 | 5/2006 |
| KR | 20100132611 | 12/2010 |
| WO | 2008016198 | 2/2008 |
| WO | 2009146243 A1 | 12/2009 |
| WO | 2013154440 A1 | 10/2013 |

* cited by examiner

INTEGRATED FLUXGATE DEVICE WITH THREE-DIMENSIONAL SENSING

BACKGROUND

A fluxgate device generally includes a magnetic core structure and coil members coiling around the magnetic core. A fluxgate device can be used for detecting a change in magnetic flux in an environment adjacent to the associated magnetic core structure. Attempts have been made to interface fluxgate devices with integrated circuits for implementing various industrial applications. For instance, a fluxgate device interfaced with a control circuit can be adapted as a current measurement device for use in motor control systems, or as a position sensing device for use in robotic systems. However, these solutions are generally costly to implement and complex to operate, and they generally do not provide three-dimensional (3D) sensing in a single package platform. Thus, there is a need for a 3D sensing fluxgate device that can be fabricated using a low-cost and high-yield process that is integratable with one or more control circuits.

SUMMARY

The present disclosure describes systems and techniques relating to the fabrication of electromagnetic sensing devices. In one aspect, a disclosed electromagnetic sensing device includes multiple integrated fluxgate dies mounted on a package substrate. One of the integrated fluxgate dies is fabricated with a shortened vertical edge such that it is mountable on the package substrate by the shorten vertical edge. The sensing direction of an integrated fluxgate die is generally orthogonal to the respective vertical edge. Advantageously, the integrated fluxgate die with the shortened vertical edge provides a sensing direction that is orthogonal to the planar surface of the package substrate.

In one implementation, for example, the present disclosure describes an integrated fluxgate device comprising a package substrate, a first integrated fluxgate die, and a second integrated fluxgate die. Both the first and second integrated fluxgate dies are mounted on the planar surface of the package substrate. The first integrated fluxgate die includes a first semiconductor substrate and a first integrated circuit formed on the first semiconductor substrate. The first integrated fluxgate die also includes a first magnetic core formed above the first integrated circuit and oriented parallel to the planar surface of the package substrate. The second integrated fluxgate includes a second semiconductor substrate and a second integrated circuit formed on the second semiconductor substrate. The second integrated fluxgate also includes a second magnetic core formed above the second integrated circuit and oriented orthogonally to the planar surface of the package substrate.

In another implementation, for example, the present disclosure describes an electromagnetic sensing device comprising a package substrate, a first die mounted on the package substrate, and a second die mounted on the package substrate. The first die includes a first integrated circuit and a first magnetic core formed above the first integrated circuit. The first magnetic core has a first sensing axis parallel to a planar surface of the package substrate. The second die includes a second integrated circuit and a second magnetic core formed above the second integrated circuit. The second magnetic core has a second sensing axis orthogonal to the planar surface of the package substrate.

In yet another implementation, for example, the present disclosure describes an integrated fluxgate circuit comprising a substrate, a circuit formed on the substrate, and a fluxgate formed above the circuit. The circuit includes transistors with active regions developed on the substrate, and a metal layer formed above the active regions to provide interconnections for the transistors. The fluxgate includes a first magnetic core segment formed above the metal layer, a second magnetic core segment aligned in parallel with the first magnetic core segment, and a coil coiling around the first and second magnetic core segment to establish an aggregated magnetic core.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

According to an aspect of the present disclosure, an integrated fluxgate device is built on a semiconductor die using the same fabrication process flow as an integrated circuit formed in the same die. As a result, the integrated fluxgate device may include one or more magnetic core structures for sensing magnetic flux in two orthogonally arranged sensing axes (e.g., X-axis and Y-axis). After the integrated fluxgate die is fabricated, it can be mounted on a package substrate. The orthogonally arranged sensing axes are typically parallel to a planar surface of the package substrate. To implement three-dimensional (3D) electromagnetic sensing, a third sensing axis (e.g., Z-axis) can be added such that it is orthogonal to a plane defined by the other two orthogonally arranged sensing axes (e.g., the X-Y plane). However, the third orthogonal sensing axis typically is added on a second package substrate because the planar surface of the first package substrate may only retain two orthogonally arranged sensing axes. As a result, the additional package substrate may render 3D sensing too space-inefficient for some compact applications. The present disclosure provides a specific solution for adding a third orthogonal sensing axis within a single package platform to facilitate space-efficient 3D sensing.

Figure 1:
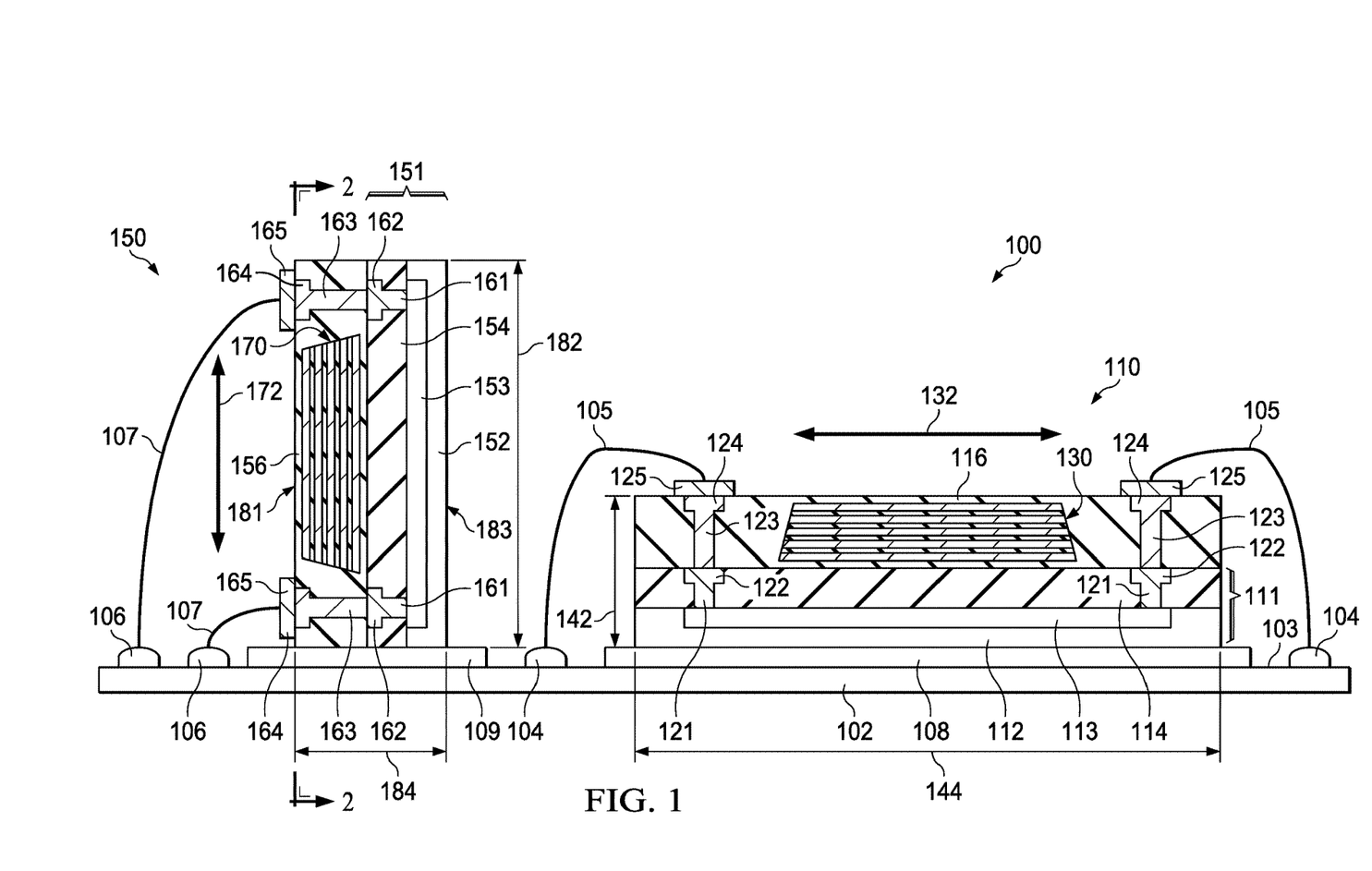
FIG. 1 shows a cross sectional side view of an electromagnetic sensing device according to an aspect of the present disclosure.

FIG. 1 shows a cross sectional side view of an electromagnetic sensing device 100 according to an aspect of the present disclosure. The electromagnetic sensing device 100 includes a package substrate 102, a first integrated fluxgate die 110, and a second integrated fluxgate die 150. The package substrate 102 has a planar surface 103 on which a first die attach platform 108 and a second die attach platform 109 are formed. The first die attach platform 108 is configured to receive and affix the first integrated fluxgate die 110 to the package substrate 102. Likewise, the second die attach platform 109 is configured to receive and affix the second integrated fluxgate die 150 to the package substrate 102. Each of the first and second die attach platforms 108 and 109 may include an epoxy material for receiving and affixing the first and second integrated fluxgate dies 110 and 150.

The first integrated fluxgate die 110 is mounted on the planar surface 103 of the package substrate 102 via the first die attach platform 108. The first integrated fluxgate die 110 is electrically coupled to the package substrate 102 via one or more first bonding wires 105 and first solder structures 104. More specifically, the first solder structures 104 are formed on the planar surface 103 of the package substrate 102, and the first solder structures 104 are electrically coupled to the wiring structures embedded in the package substrate 102. The first bonding wires 105 electrically connect the first integrated fluxgate die 110 to the first solder structures 104, thereby allowing the first integrated fluxgate die 110 to be electrically coupled to the package substrate 102.

The first integrated fluxgate die 110 includes a first integrated fluxgate circuit, which integrates a first sensor circuit with a first fluxgate device on a single semiconductor die. The first integrated fluxgate die 110 includes a first semiconductor substrate 112, a circuit layer 114 formed on the first semiconductor substrate 112, and a fluxgate layer 116 formed on the circuit layer 114. The first semiconductor substrate 112 includes one or more transistor active regions 113, on which several transistor devices are formed. The circuit layer 114 includes one or more conductive wiring layers (e.g., polysilicon and/or metal wiring layers) for interconnecting the transistor devices formed within the transistor active regions 113. Together, the circuit layer 114 and the transistor active regions 113 form a first integrated circuit 111, which is configured to perform one or more sensing operations of the first fluxgate device formed in the fluxgate layer 116.

The first integrated fluxgate circuit embodied in the first integrated fluxgate die 110 includes inter-device connection structures for connecting the first integrated circuit 111 with the first fluxgate device formed in the fluxgate layer 116. In one implementation, the first integrated fluxgate die 110 includes lower vias 121, lower interconnect metal layers 122, upper vias 123, and upper interconnect metal layers 124. The first integrated circuit 111 can be connected to the first fluxgate device (e.g., 116) using the lower vias 121 and the lower interconnect metal layers 122. Moreover, an external circuitry (e.g., the package substrate 102 and the second integrated fluxgate die 150) may communicate with the first integrated circuit 111 via one or more first bond pads 125, which are electrically coupled to the upper interconnect metal layers 124, then to the upper vias 123, and then to the lower interconnect metal layers 122 and the lower vias 121.

Formed in the fluxgate layer 116, the first fluxgate device includes a first magnetic core 130. The first magnetic core 130 is thus positioned above the first integrated circuit 111, and the first magnetic core 130 is oriented parallel to the planar surface 103 of the package substrate 102. Accordingly, the first magnetic core 130 has a first sensing axis 132 that is parallel to the planar surface 103 of the package substrate 102. The first integrated circuit 111 includes one or more sensor circuits for calibrating and controlling the operations of the first magnetic core 130. As a result, the first integrated fluxgate circuit embodied in the first integrated fluxgate die 110 may sense a magnetic field that is parallel to the planar surface 103 of the package substrate 102.

The second integrated fluxgate die 150 is laterally (or vertically) mounted on the planar surface 103 of the package substrate 102 via the second die attach platform 109. The second integrated fluxgate die 150 is electrically coupled to the package substrate 102 via one or more second bonding wires 107 and second solder structures 106. More specifically, the second solder structures 106 are formed on the planar surface 103 of the package substrate 102, and the second solder structures 106 are electrically coupled to the wiring structures embedded in the package substrate 102. The second bonding wires 107 electrically connect the second integrated fluxgate die 150 to the second solder structures 106, thereby allowing the second integrated fluxgate die 150 to be electrically coupled to the package substrate 102. Accordingly, the second integrated fluxgate die 150 can establish a connection with the first integrated fluxgate die 110 via the package substrate 102.

The second integrated fluxgate die 150 includes a second integrated fluxgate circuit, which integrates a second sensor circuit with a second fluxgate device on a single semiconductor die. The second integrated fluxgate die 150 includes a second semiconductor substrate 152, a circuit layer 154 formed on the second semiconductor substrate 152, and a fluxgate layer 156 formed on the circuit layer 154. The second semiconductor substrate 152 includes one or more transistor active regions 153, on which several transistor devices are formed. The circuit layer 154 includes one or more conductive wiring layers (e.g., polysilicon and/or metal wiring layers) for interconnecting the transistor devices formed within the transistor active regions 153. Together, the circuit layer 154 and the transistor active regions 153 form a second integrated circuit 151, which is configured to perform one or more sensing operations of the second fluxgate device formed in the fluxgate layer 156.

The second integrated fluxgate circuit embodied in the second integrated fluxgate die 150 includes inter-device connection structures for connecting the second integrated circuit 151 with the second fluxgate device formed in the fluxgate layer 156. In one implementation, the second integrated fluxgate die 150 includes lower vias 161, lower interconnect metal layers 162, upper vias 163, and upper interconnect metal layers 164. The second integrated circuit 151 can be connected to the second fluxgate device (e.g., 156) using the lower vias 161 and the lower interconnect metal layers 162. Moreover, an external circuitry (e.g., the package substrate 102 and the first integrated fluxgate die 110) may communicate with the second integrated circuit 151 via one or more second bond pads 165, which are electrically coupled to the upper interconnect metal layers 164, then to the upper vias 163, and then to the lower interconnect metal layers 162 and the lower vias 161.

Formed in the fluxgate layer 156, the second fluxgate device includes a second magnetic core 170. The second magnetic core 170 is thus positioned above the second integrated circuit 151, and the second magnetic core 170 is oriented orthogonal to the planar surface 103 of the package substrate 102. Accordingly, the second magnetic core 170 has a second sensing axis 172 that is orthogonal to the planar surface 103 of the package substrate 102 as well as the first sensing axis 132. The second integrated circuit 151 includes one or more sensor circuits for calibrating and controlling the operations of the second magnetic core 170. Alternatively, one or more sensor circuits in the first integrated circuit 111 may calibrate and control the operations of the second magnetic core 170 via the connection established by the package substrate 102. In either case, the second integrated fluxgate circuit embodied in the second integrated fluxgate die 150 may sense a magnetic field that is orthogonal to the planar surface 103 of the package substrate 102.

Together, the first and second integrated fluxgate circuits (e.g., 110 and 150) can be configured to sense a magnetic field in two orthogonally arranged axes (e.g., 132 and 172). One of these two axes is parallel to the planar surface 103, while the other one of the two axes is orthogonal to the planar surface 103. in one implementation, each of the first and second integrated fluxgate circuits (e.g., 110 and 150) may independently control the sensing along each sensing axis. For instance, the first integrated circuit 111 can be configured to generate a first excitation signal, and the second integrated circuit 151 can be configured to generate a second excitation signal independent of the first excitation signal Then, the first magnetic core 130 is configured to sense a first magnetic field along the first sensing axis 132 in response to the first excitation signal. Separately, the second magnetic core 170 is configured to sense a second magnetic field along the second sensing axis 172 in response to the second excitation signal.

In another implementation, the first and second integrated fluxgate circuits (e.g., 110 and 150 may be commonly controlled for sensing a magnetic field in both sensing axes (e.g., 132 and 172). For instance, either one of the first integrated circuit 111 or the second integrated circuit 151 can be configured to generate a first excitation signal. Then, the first magnetic core 130 is configured to sense a first magnetic field along the first sensing axis 132 in response to the first excitation signal. In a similar fashion, the second magnetic core 170 is configured to sense a second magnetic field along the second sensing axis 172 in response to the first excitation signal.

Figure 3:
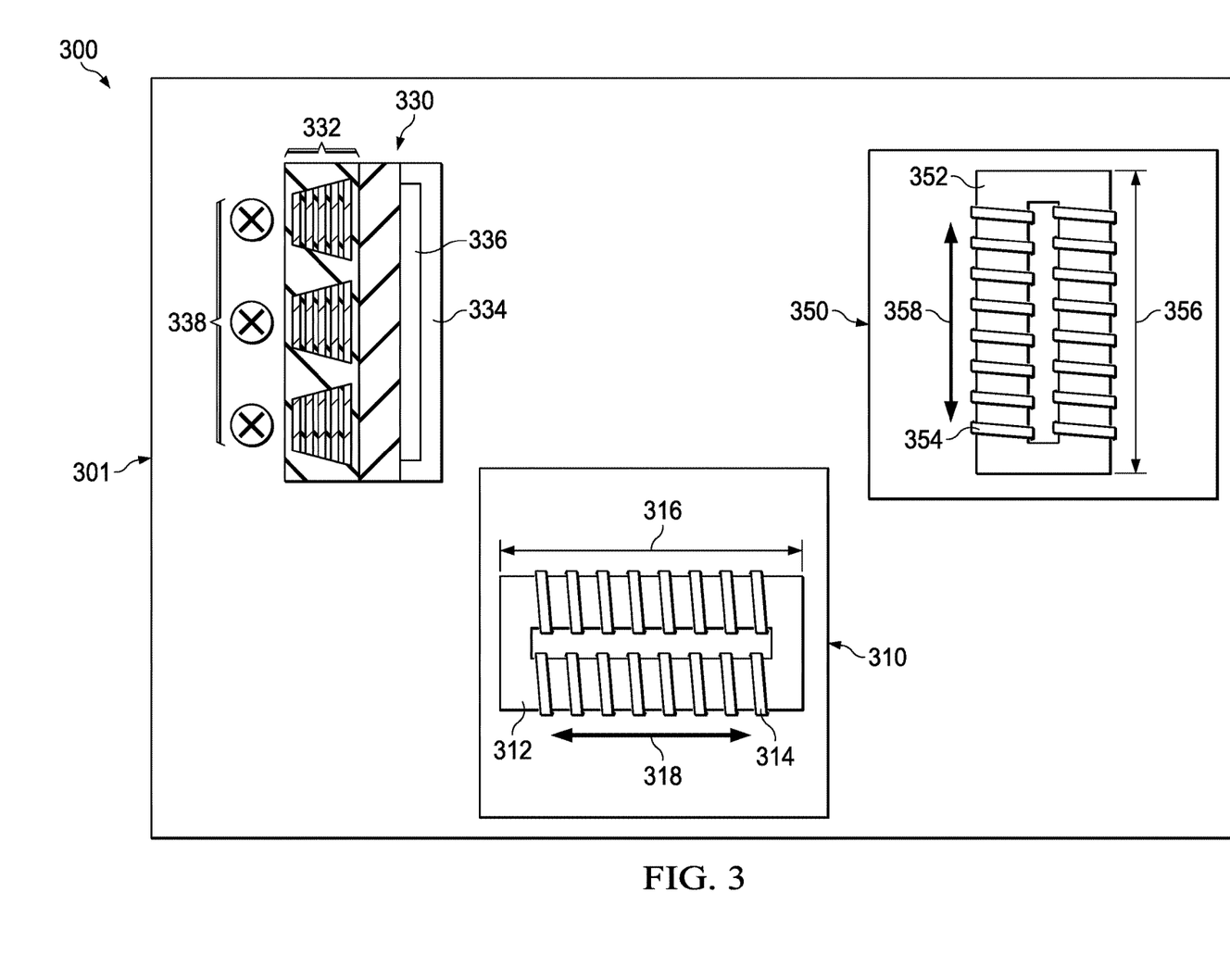
FIG. 3 shows a top view of a three-dimensional (3D) electromagnetic sensing device according to an aspect of the present disclosure.
Figure 4:
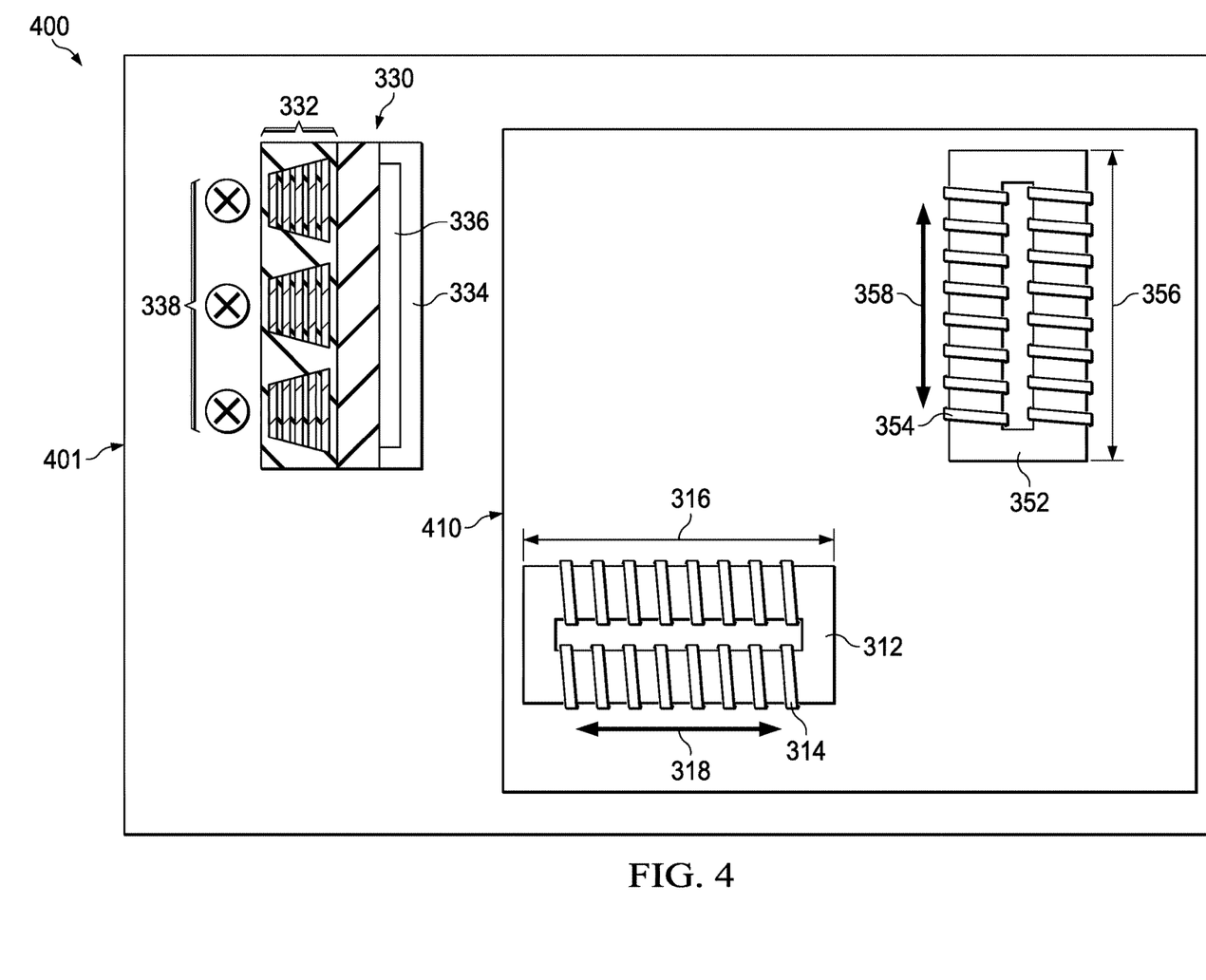
FIG. 4 shows a top view of another 3D electromagnetic sensing device according to another aspect of the present disclosure.

To enable 3D sensing, a third magnetic core (see, e.g., a third magnetic core 352 as shown in FIGS. 3 and 4) can be added to the electromagnetic sensing device 100. The third magnetic core has a third sensing axis (see, e.g., a third sensing axis 358 as shown in FIGS. 3 and 4), and it is so arranged that the third sensing axis is orthogonal to both the first and second sensing axes (e.g., 132 and 172). That way, the first and third sensing axes form a first sensing plane (e.g., an X-Y plane), the first and second sensing axes form a second sensing plane (e.g., an X-Z plane), and the third and second sensing axes form a third sensing plane (e.g., a Y-Z plane).

Because the second magnetic core 172 is arranged at a vertical position with respect to the package substrate 102, the third magnetic core can be arranged at a horizontal position with respect to the package substrate 102. As such, the arrangement of the third magnetic core can be similar to the arrangement of the first magnetic core 130. Indeed, the third magnetic core can be integrated to the first integrated fluxgate die 110 according to an aspect of the present disclosure (see, e.g., FIG. 4). To simplify the fabrication process of the first integrated fluxgate die 110 however, the third magnetic core can be implemented by a third integrated fluxgate die according to another aspect of the present disclosure (see, e.g., FIG. 3). In either case, the present disclosure provides a space-efficient and low cost solution for performing 3D electromagnetic sensing using a single package platform.

The first integrated fluxgate die 110 typically has a first attachment base width 144 and a first height 142. Meanwhile, the second integrated fluxgate die 150 has a second attachment base width 184 that is commensurate with the first height 142, and a second height 182 that is less than the first attachment base width 144. In one implementation, for example, the second height 182 can be less than a half of the first attachment base width 144. In another implementation, for example, the second height 182 can be less than one-third of the first attachment base width 144. Thus, it is understood that the lateral dimension of the second integrated fluxgate die 150 can be less than the lateral dimension of the first integrated fluxgate die 110. With this dimensional relationship, the second integrated fluxgate die 150 can be mounted laterally (i.e., flipped up) without significantly increasing the vertical size of the overall package.

Figure 2:
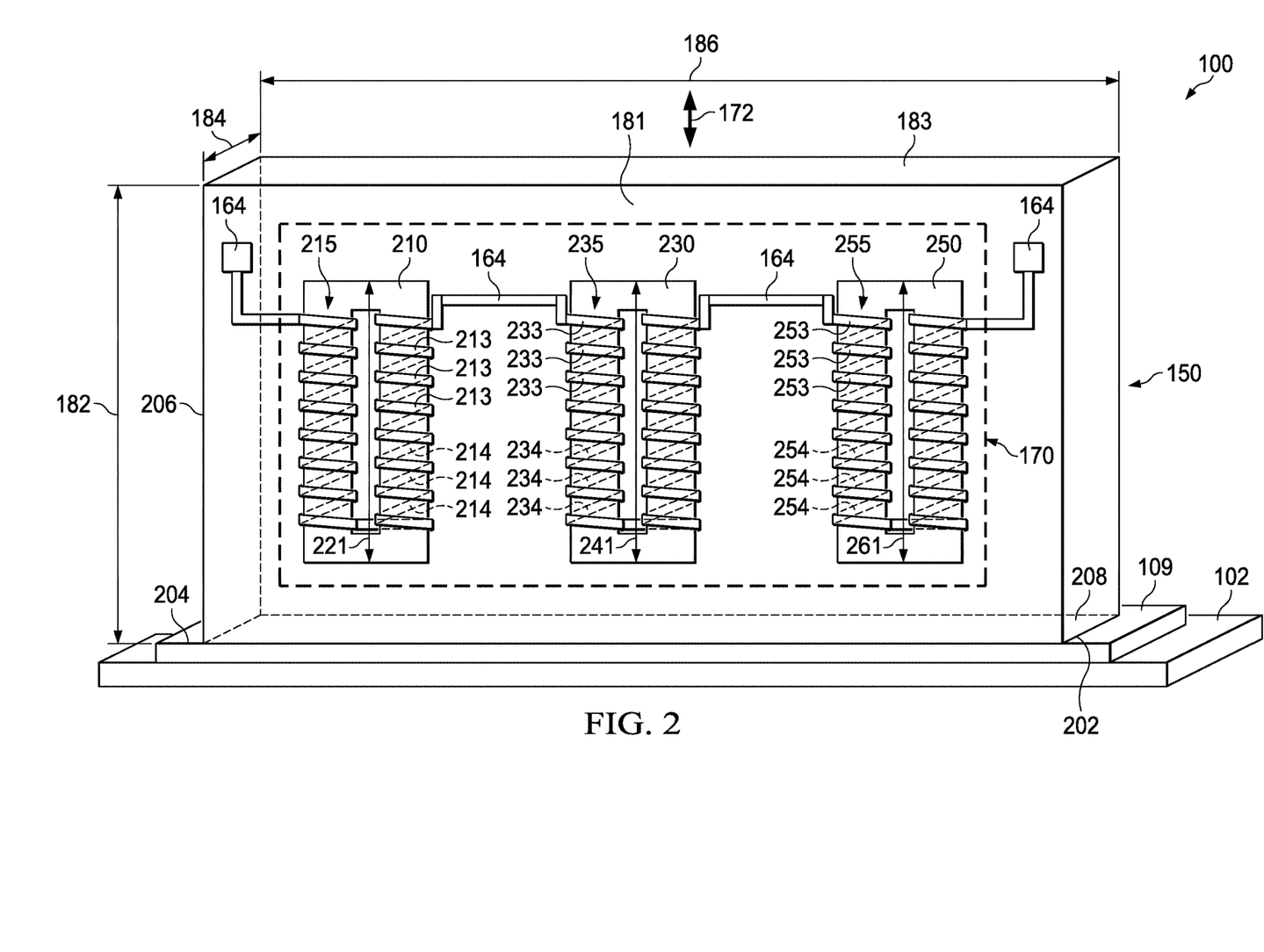
FIG. 2 shows a partially exposed perspective view of the electromagnetic sensing device according to another aspect of the present disclosure.

FIG. 2 shows a partially exposed perspective view of the electromagnetic sensing device 100 taken from a cross-section lines 2-2 as indicated in FIG. 1. The second integrated fluxgate die 150 has a vertical edge 202, a first horizontal edge 204, and a second horizontal edge 206, The vertical edge 202 is defined along a direction in which the second integrated fluxgate circuit is formed, and thus, the vertical edge 202 is perpendicular to a top surface 181 and a bottom surface 183 of the second integrated fluxgate gate die 150. As such, the dimension of the vertical edge 202 corresponds to a thickness of the second integrated fluxgate die 150.

The first horizontal edge 204 and the second horizontal edge 206 are parallel to the top surface 181 and bottom surface 183 of the second integrated fluxgate die 150. The first horizontal edge 204 defines a direction that is perpendicular to the second sensing axis 172, whereas the second horizontal edge 206 defines a direction that is parallel to the second sensing axis 172. In general, the first horizontal edge 204 is longer than the second horizontal edge 206. Unlike the first integrated fluxgate die 110, which is mounted horizontally to the package substrate 102, the second integrated fluxgate die 150 is mounted laterally to the package substrate 102. As such, the vertical edge 202 and the first horizontal edge 204 define a mountable surface 208, along which the second integrated fluxgate die 150 is mounted to the package substrate 102. Moreover, unlike the first integrated fluxgate die 110, the second integrated fluxgate die 150 has the second horizontal edge 206 oriented orthogonal to the planar surface 103 of the package substrate 102.

To achieve a space-efficient package arrangement of the electromagnetic sensing device 100, the vertical edge 202, the first horizontal edge 204, and the second horizontal edge 206 may each adopt a dimensional relationship. The vertical edge 202 has a first base width 184. The first horizontal edge 204 has a second base width 186. The second horizontal edge 206 has a height 182. In one implementation, the height 182 is greater than the first base width 184 but less than three times of the first base width 184. For example, when the first base width is 0.4 mm, the height may be less than 1.2 mm. In another implementation, the height 182 may be less than 1 mm such that the second integrated fluxgate die 150 can be fitted within a 1 mm tall package.

According to an aspect of the present disclosure, the second magnetic core 170 is configured to have a sensitivity that is commensurate with that of the first magnetic core 130. As such, the hard magnetic axis of the second magnetic core 170 has an aggregated length that is commensurate with that of the hard magnetic axis of the first magnetic core 130. However, the dimensions of the second magnetic core 170 is limited by the height 182 of the second integrated fluxgate die 150 because the second sensing axis 172 is oriented orthogonal to the planar surface 103 of the package substrate 102. To that end, the second magnetic core 170 may adopt a different configuration than the first magnetic core 130.

In one implementation, for example, the second magnetic core 170 can be severed into multiple magnetic core segments. These magnetic core segments are aligned in parallel with each other and orthogonal to the vertical edge 202 of the second integrated fluxgate die 150. Each of these magnetic core segments has a segment length. When combined, the aggregated segment length of the magnetic core segments roughly equals or greater than a contiguous length of the first magnetic core 130. The segment length may be equally distributed among the magnetic core segments. Alternatively, one magnetic core segment may have a different segment length than another magnetic core segment.

As an example, the second magnetic core 170 may include a first magnetic core segment 210, a second magnetic core segment 230, and a third magnetic core segment 250. Each of the first, second, and third magnetic core segments 210, 230, and 250 is formed above, and insulated from, the lower interconnect mater layers 122 as shown in FIG. 1. Thus, the magnetic core segments 210, 230, and 250 is free of interference from the second integrated circuit 151 positioned thereunder. As shown in FIG. 2, the first, second, and third magnetic core segments 210, 230, and 250 are aligned parallel with each other. Each of the first, second, and third magnetic core segments 210, 230, and 250 is aligned orthogonal to the vertical edge 202 and parallel to the first and second horizontal edges 204 and 206. When an electromagnetic coupling is established, the first, second, and third magnetic core segments 210, 230, and 250 function as a single magnetic core.

In combination, the first, second, and third magnetic core segments 210, 230, and 250 have an aggregated core length that is commensurate with the contiguous core length of the first magnetic core 130 in order to retain a similar sensitivity as the first magnetic core 130. In one implementation, the aggregated core length of the second magnetic core 170 can be substantially the same as the contiguous core length of the first magnetic core 130. Thus, where the contiguous core length of the first magnetic core 130 is 1 mm, the aggregated core length of the second magnetic core 170 can be 1 mm with a 10% deviation. In another implementation, the aggregated core length of the second magnetic core 170 can be greater than the contiguous core length of the first magnetic core 130. Thus, where the contiguous core length of the first magnetic core 130 is 1 mm, the aggregated core length of the second magnetic core 170 can be 1.2 mm with a 10% deviation.

The aggregated core length can be distributed evenly among the magnetic core segments. In one configuration, for example, the first magnetic core segment 210 has a first segment core length 221 that is equal to a second segment core length 241 of the second magnetic core segment 230 and a third segment core length 261 of the third magnetic core segment 250. Together, the first, second, and third segment core lengths 221, 241, and 261 define the aggregated core length. Each of first, second, and third segment core lengths 221, 241, and 261 can be approximately one-third of the contiguous core length of the first magnetic core 130. Thus, where the contiguous core length of the first magnetic core 130 ranges from 1 mm to 2 mm, each of the first, second, and third segment core lengths 221, 241, and 261 may range from 0.3 mm to 0.7 mm.

According to an aspect of the present disclosure, an electromagnetic coupling can be established between the first, second, and third core segments 210, 230, and 250 to form an aggregated magnetic core 170. More specifically, the electromagnetic coupling can be established by a contiguous coil including multiple coil segments. In one implementation, for example, the second integrated fluxgate die 150 includes a contiguous coil encompassing a first coil segment 215, a second coil segment 235, and a third coil segment 255. The first, second, and third coil segments 215, 235, and 255 are formed within the fluxgate layer 156 (see FIG. 1), and they are connected by conducting wires of an interconnect metal layer, such as the upper interconnect metal layers 164.

The first coil segment 215 coils around the first magnetic core segment 210. The first coil segment 215 includes first top coil members 213 and first bottom coil members 214. The first top coil members 213 can be formed in one of the upper interconnect metal layers 164, whereas the first bottom coil members 214 can be formed below the first top coil members 213. The first top coil members 213 are connected to the first bottom coil members 214 by the upper vias 163 (see FIG. 1) to form the coil rings in the first coil segment 215. The first coil segment 215 is connected to the second coil segment 235 using a wire structure formed in one of the upper interconnect metal layers 164. In one implementation, the first coil segment 215 can be connected to the second coil segment 235 using a wiring structure in the same metal layer of the first top coil members 213. In another implementation, the first coil segment 215 can be connected to the second coil segment 235 using a wiring structure in the same metal layer of the first bottom coil members 214.

The second coil segment 235 coils around the second magnetic core segment 230. The second coil segment 235 includes second top coil members 233 and second bottom coil members 234. The second top coil members 233 can be formed in one of the upper interconnect metal layers 164, whereas the second bottom coil members 234 can be formed below the second top coil members 233. The second top coil members 233 are connected to the second bottom coil members 234 by the upper vias 163 (see FIG. 1) to form the coil rings in the second coil segment 235. The second coil segment 235 is connected to the third coil segment 255 using a wire structure formed in one of the upper interconnect metal layers 164. In one implementation, the second coil segment 235 can be connected to the third coil segment 255 using a wiring structure in the same metal layer of the second top coil members 233. In another implementation, the second coil segment 235 can be connected to the third coil segment 255 using a wiring structure in the same metal layer of the second bottom coil members 234.

The third coil segment 255 coils around the third magnetic core segment 250. The third coil segment 255 includes third top coil members 253 and third bottom coil members 254. The third top coil members 253 can be formed in one of the upper interconnect metal layers 164, whereas the third bottom coil members 254 can be formed below the third top coil members 253. The third top coil members 253 are connected to the third bottom coil members 254 by the upper vias 163 (see FIG. 1) to form the coil rings in the third coil segment 255. When the coil segments 215, 235, and 255 are activated, the magnetic core segment 210, 230, and 250 are configured to sense a magnetic field in the second sensing axis 172.

Although FIG. 2 shows a single coil coiling around the first, second, and third magnetic core segments 210, 230, and 250, multiple coils can be added to coil around these core segments. In one implementation, for example, the second integrated fluxgate die 150 may include a first coil for sensing a voltage across the first, second, and third magnetic core segments 210, 230, and 250, and a second coil for conducting an excitation current flowing around the first, second, and third magnetic core segments 210, 230, and 250.

The first and second coils may have the same structural characteristics as described above. For instance, the top coil members (e.g., 213, 233, and 253) of the first and second coils can be formed in a top interconnect metal layer (e.g., 164), which is orthogonal to the vertical edge 202 and parallel to the first and second horizontal edges 204 and 206.

As described above, the present disclosure provides a space-efficient and low cost solution for performing 3D electromagnetic sensing using a single package platform. To enable 3D sensing, a third magnetic core can be added to the electromagnetic sensing device 100. The third magnetic core has a third sensing axis, and it is so arranged that the third sensing axis is orthogonal to both the first and second sensing axes (see, e.g., 132 and 172 in FIG. 1). That way, the first and third sensing axes form a first sensing plane (e.g., an X-Y plane), the first and second sensing axes form a second sensing plane (e.g., an X-Z plane), and the third and second sensing axes form a third sensing plane (e.g., a Y-Z plane).

FIG. 3 shows a top view of a 3D electromagnetic sensing (EMS) device 300 according to an aspect of the present disclosure. The 3D EMS device 300 is modified based on the electromagnetic sensing device 100 as shown and described in FIGS. 1 and 2. The 3D EMS device 300 defines three orthogonally arranged sensing axes (i.e., 318, 338, and 358) for sensing a magnetic field in three orthogonally arranged planes (e.g., the X-Y, X-Z, and Y-Z planes). Specifically, the 3D EMS device 300 includes three separate integrated fluxgate dies for activating the three orthogonally arranged sensing axes. Like the EMS device 100, the 3D EMS device 300 includes a package substrate 301 for mounting a first die 310, a second die 330, and a third die 350 on its planar surface.

The first die 310 incorporates the structure features of the first integrated fluxgate die 110 as shown and described in FIG. 1. For example, the first die 310 includes a first magnetic core 312 coiled by a first coil 314. The first magnetic core 312 has a first contiguous core length 316 that is sufficient to sense a magnetic field along a first sensing axis 318. In one implementation, for example, the first contiguous core length 316 may range from 0.7 mm to 2 mm. In another implementation, the first contiguous core length 316 may be 1 mm. The first sensing axis 318 is parallel to the planar surface of the package substrate 301.

The second die 330 incorporates the structure features of the second integrated fluxgate die 150 as shown and described in FIGS. 1 and 2. For example, the second die 330 includes a second magnetic core 332 formed above the a transistor active region 336 developed within a semiconductor substrate 334. The second magnetic core 332 has two or more (e.g., three) core segments, each having a segment core length. The segment core lengths can be aggregated to an aggregated core length that is sufficient to sense a magnetic field along a second sensing axis 338. In one implementation, the aggregated core length may range from 0.7 mm to 2 mm. In another implementation, the aggregated core length may be 1 mm. The second sensing axis 338 is orthogonal to the first sensing axis 318 and the planar surface of the package substrate 301. Together, the first and second sensing axes 318 and 338 define a first sensing plane (e.g., X-Z plane) that is orthogonal to the planar surface of the package substrate 301.

Like the first die 310, the third die 350 incorporates the structure features of the first integrated fluxgate die 110 as shown and described in FIG. 1. For example, the third die 350 includes a third magnetic core 352 coiled by a third coil 354. The third magnetic core 352 has a second contiguous core length 356 that is sufficient to sense a magnetic field along a third sensing axis 358. In one implementation, for example, the second contiguous core length 356 may range from 0.7 mm to 2 mm. In another implementation, the second contiguous core length 356 may be 1 mm. Like the first sensing axis 318, the third sensing axis 358 is parallel to the planar surface of the package substrate 301. The third sensing axis 358 is orthogonal to the first sensing axis 318 to define a second sensing plane (e.g., the X-Y plane) therewith. The third sensing axis 358 is also orthogonal to the second sensing axis 338 to define a third sensing plane (e.g., the Y-Z plane) therewith. While the second sensing plane is parallel to the planar surface of the package substrate 301, the third sensing plane is orthogonal to the planar surface of the package substrate 301.

Each of the first, second, and third dies 310, 330, and 350 may generate its own excitation signal and perform electromagnetic sensing in response to these individually generated excitation signals. Alternatively, one of the first, second, and third dies 310, 330, and 350 may generate a common excitation signal, which causes each of first, second, and third dies 310, 330, and 350 to perform electromagnetic sensing. Advantageously, the 3D EMS device 300 provides a space-efficient and low cost solution to perform 3D sensing on a single package substrate.

FIG. 4 shows a top view of another 3D electromagnetic sensing device 400 according to another aspect of the present disclosure. The 3D EMS device 400 is modified based on the electromagnetic sensing device 100 as shown and described in FIGS. 1 and 2 and the 3D EMS device 300 as shown and described in FIG. 3. The 3D EMS device 400 defines three orthogonally arranged sensing axes (i.e., 318, 338, and 358) for sensing a magnetic field in three orthogonally arranged planes (e.g., the X-Y, X-Z, and Y-Z planes). Specifically, the 3D EMS device 300 includes two separate integrated fluxgate dies for activating the three orthogonally arranged sensing axes. Like the EMS device 100, the 3D EMS device 400 includes a package substrate 401 for mounting a first die 410 and a second die 330 on its planar surface.

The first die 410 can be a combination of the first die 310 and the third die 350 as shown and described in FIG. 3. Specifically, the first die 410 may incorporate both the first magnetic core 312 and the third magnetic core 352 to a single die structure. Advantageously, the first die 410 in the 3D EMS device 400 provides additional space efficiency when compared to the implementation of the 3D EMS device 300.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated fluxgate device, comprising:
    a package substrate having a planar surface;
    a first integrated fluxgate die mounted on the planar surface of the package substrate, the first integrated fluxgate die including:
        a first semiconductor substrate;
        an integrated circuit formed on the first semiconductor substrate; and
        a magnetic core formed above the integrated circuit and oriented parallel to the planar surface of the package substrate; and
    a second integrated fluxgate die mounted on the planar surface of the package substrate, the second integrated fluxgate die including:
        a second semiconductor substrate;
        an integrated circuit formed on the second semiconductor substrate; and
        segmented magnetic cores formed above the integrated circuit and oriented orthogonally to the planar surface of the package substrate.

2. The integrated fluxgate device of claim 1, wherein the first integrated fluxgate die includes another magnetic core formed above the integrated circuit and oriented parallel to the planar surface of the package substrate and orthogonally to each of the magnetic cores.

3. The integrated fluxgate device of claim 1, further comprising:
    a third integrated fluxgate die mounted on the planar surface of the package substrate, the third integrated fluxgate die including:
        a semiconductor substrate;
        an integrated circuit formed on the semiconductor substrate; and
        a magnetic core formed above the integrated circuit and oriented parallel to the planar surface of the package substrate and orthogonally to the magnetic cores of the first and second integrated fluxgate dies.

4. The integrated fluxgate device of claim 1, wherein:
    the second integrated fluxgate die has a vertical edge, a first horizontal edge, and a mountable surface defined by the vertical edge and the first horizontal edge; and
    the second integrated fluxgate die is mounted to the package substrate by the mountable surface.

5. The integrated fluxgate device of claim 4, wherein the second integrated fluxgate die has a second horizontal edge arranged perpendicular to the first horizontal edge, the second horizontal edge having a length less than 1 mm and position orthogonally to the planar surface of the package substrate.

6. The integrated fluxgate device of claim 4, wherein the integrated circuit of the second integrated fluxgate die includes a top metal layer arranged orthogonally to the vertical edge and parallel to the first horizontal edge.

7. The integrated fluxgate device of claim 4, wherein the segmented magnetic cores of the second integrated fluxgate die are aligned in parallel with each other and orthogonally to the vertical edge of the second integrated fluxgate die.

8. The integrated fluxgate device of claim 7, wherein each of the segmented magnetic cores has a segment length equal to or less than 0.7 mm.

9. The integrated fluxgate device of claim 7, wherein:
    the magnetic core of the first integrated fluxgate die has a contiguous core length; and
    the segmented magnetic cores of the second integrated fluxgate die have an aggregated core length substantially the same as the contiguous core length.

10. The integrated fluxgate device of claim 7, wherein:
    the magnetic core of the first integrated fluxgate die has a contiguous core length; and
    each of the segmented magnetic cores of the second integrated fluxgate die has a core length approximately one-third of the contiguous core length.

11. The integrated fluxgate device of claim 1, wherein the segmented magnetic cores function as an aggregated magnetic core when electromagnetic coupling is established.

12. The integrated fluxgate device of claim 1, wherein the second integrated fluxgate die includes a contiguous coil encompassing a coil segment of each of the segmented magnetic cores.

13. The integrated fluxgate device of claim 1, wherein the segmented magnetic cores are electrically coupled together in series.

14. An electromagnetic sensing device, comprising:
    a package substrate having a planar surface;
    a first die mounted on the package substrate, the first die including:
        an integrated circuit; and a magnetic core formed above the integrated circuit, and having a sensing axis parallel to the planar surface of the package substrate; and a second die mounted on the package substrate, the second die including:

an integrated circuit; and segmented magnetic cores formed above the integrated circuit, and having a sensing axis orthogonal to the planar surface of the package substrate.

15. The electromagnetic sensing device of claim 14, wherein:

the first die includes a second magnetic core formed above the integrated circuit; and the second magnetic core includes a second sensing axis parallel to the planar surface of the package substrate and orthogonally to the sensing axis and the sensing axis of the second die.

16. The electromagnetic sensing device of claim 14, further comprising:

a third die mounted on the package substrate, the third die including:

an integrated circuit; and a magnetic core formed above the integrated circuit, and having a sensing axis parallel to the planar surface and orthogonal to the sensing axis of the first die and the sensing axis of the second die.

17. The electromagnetic sensing device of claim 14, wherein:

the integrated circuit of the first die is configured to generate an excitation signal; and the magnetic core of the first die is configured to sense a magnetic field along the sensing axis in response to the excitation signal.

18. The electromagnetic sensing device of claim 17, wherein:

the integrated circuit of the second die is configured to generate an excitation signal; and the magnetic core of the second die is configured to sense a magnetic field along the sensing axis in response to the excitation signal.

19. The electromagnetic sensing device of claim 17, wherein:

the magnetic core of the second die is configured to sense a magnetic field along the sensing axis in response to the excitation signal generated by the integrated circuit of the first die; and the integrated circuit is configured to measure the sensed magnetic field in response to the excitation signal generated by the integrated circuit of the first die.

20. The electronic sensing device of claim 14, wherein the segmented magnetic cores function as an aggregated magnetic core when electromagnetic coupling is established.

21. The electronic sensing device of claim 14, wherein the second integrated fluxgate die includes a contiguous coil encompassing a coil segment of each of the segmented magnetic cores.

22. The electronic sensing device of claim 14, wherein the segmented magnetic cores are electrically coupled together in series.

23. A method of making an integrated fluxgate device, comprising:

providing a package substrate having a planar surface;

providing a first integrated fluxgate die mounted on the planar surface of the package substrate, the first integrated fluxgate die including:

a first semiconductor substrate;

an integrated circuit formed on the first semiconductor substrate; and a magnetic core formed above the integrated circuit and oriented parallel to the planar surface of the package substrate; and providing a second integrated fluxgate die mounted on the planar surface of the package substrate, the second integrated fluxgate die including:

a second semiconductor substrate;

an integrated circuit formed on the second semiconductor substrate; and segmented magnetic cores formed above the integrated circuit and oriented orthogonally to the planar surface of the package substrate.

24. The method of making an integrated fluxgate device of claim 23, wherein the first integrated fluxgate die includes a third magnetic core formed above the integrated circuit and oriented parallel to the planar surface of the package substrate and orthogonally to the magnetic core and segmented magnetic cores.

25. The method of making an integrated fluxgate device of claim 23, further comprising:

providing a third integrated fluxgate die mounted on the planar surface of the package substrate, the third integrated fluxgate die including:

a semiconductor substrate;

an integrated circuit formed on the semiconductor substrate; and a magnetic core formed above the integrated circuit and oriented parallel to the planar surface of the package substrate and orthogonally to the magnetic cores of the first and second integrated fluxgate dies.

26. The method of making an integrated fluxgate device of claim 23, wherein:

the second integrated fluxgate die has a vertical edge, a first horizontal edge, and a mountable surface defined by the vertical edge and the first horizontal edge; and the second integrated fluxgate die is mounted to the package substrate by the mountable surface.

27. The method of making an integrated fluxgate device of claim 26, wherein the second integrated fluxgate die has a second horizontal edge arranged perpendicular to the first horizontal edge, the second horizontal edge having a length less than 1 mm and position orthogonally to the planar surface of the package substrate.

28. The method of making an integrated fluxgate device of claim 26, wherein the integrated circuit of the second integrated fluxgate die includes a top metal layer arranged orthogonally to the vertical edge and parallel to the first horizontal edge.

29. The method of making an integrated fluxgate device of claim 26, wherein the segmented magnetic cores of the second integrated fluxgate die are aligned in parallel with each other and orthogonally to the vertical edge of the second integrated fluxgate die.

30. The method of making an integrated fluxgate device of claim 29, wherein each of the segmented magnetic cores has a length equal to or less than 0.7 mm.

31. The method of making an integrated fluxgate device of claim 29, wherein:

the magnetic core of the first integrated fluxgate die has a contiguous core length; and the segmented magnetic cores of the second integrated fluxgate die have an aggregated core length substantially the same as the contiguous core length.

32. The method of making an integrated fluxgate device of claim 29, wherein:

the magnetic core of the first integrated fluxgate die has a contiguous core length; and each of the segmented magnetic cores of the second integrated fluxgate die has a segment core length approximately one-third of the contiguous core length.

33. The method of making an integrated fluxgate device of claim 23, wherein the segmented magnetic cores function as an aggregated magnetic core when electromagnetic coupling is established.

34. The method of making an integrated fluxgate device of claim 23, wherein the second integrated fluxgate die includes a contiguous coil encompassing a coil segment of each of the segmented magnetic cores.

35. The method of making an integrated fluxgate device of claim 23, wherein the segmented magnetic cores are electrically coupled together in series.

36. A method of making an electromagnetic sensing device, comprising:

providing a package substrate having a planar surface;

providing a first die mounted on the package substrate, the first die including:
an integrated circuit; and
a magnetic core formed above the integrated circuit, and having a sensing axis parallel to the planar surface of the package substrate; and providing a second die mounted on the package substrate, the second die including:
an integrated circuit; and
segmented magnetic cores formed above the integrated circuit, and having a sensing axis orthogonal to the planar surface of the package substrate.

37. The method of making an electromagnetic sensing device of claim 36, wherein:

the first die includes a second magnetic core formed above the integrated circuit; and the second magnetic core includes a second sensing axis parallel to the planar surface of the package substrate and orthogonally to the sensing axis and the sensing axis of the second die.

38. The method of making an electromagnetic sensing device of claim 36, further comprising:

providing a third die mounted on the package substrate, the third die including:
an integrated circuit; and
a magnetic core formed above the integrated circuit, and having a sensing axis parallel to the planar surface and orthogonal to the sensing axis of the first die and the sensing axis of the second die.

39. The method of making an electromagnetic sensing device of claim 36, wherein:

the integrated circuit of the first die is configured to generate an excitation signal; and the magnetic core of the first die is configured to sense a magnetic field along the sensing axis in response to the excitation signal.

40. The method of making an electromagnetic sensing device of claim 39, wherein:

the integrated circuit of the second die is configured to generate an excitation signal; and the segmented magnetic cores of the second die are configured to sense a magnetic field along the sensing axis in response to the excitation signal.

41. The method of making an electromagnetic sensing device of claim 39, wherein:

the segmented magnetic cores of the second die are configured to sense a magnetic field along the sensing axis in response to the excitation signal generated by the integrated circuit of the first die; and the integrated circuit is configured to measure the sensed magnetic field in response to the excitation signal generated by the integrated circuit of the first die.

42. The method of making an electromagnetic sensing device of claim 36, wherein the segmented magnetic cores function as an aggregated magnetic core when electromagnetic coupling is established.

43. The method of making an electromagnetic sensing device of claim 36, wherein the second integrated fluxgate die includes a contiguous coil encompassing a coil segment of each of the segmented magnetic cores.

44. The method of making an electromagnetic sensing device of claim 36, wherein the segmented magnetic cores are electrically coupled together in series.

45. An integrated fluxgate device, comprising:

a package substrate;

a first integrated fluxgate die mounted on the package substrate, the first integrated fluxgate die including:
a first semiconductor substrate;
an integrated circuit formed on the first semiconductor substrate; and
a magnetic core formed above the integrated circuit and oriented parallel to the package substrate; and a second integrated fluxgate die mounted on the package substrate, the second integrated fluxgate die including:
a second semiconductor substrate;
an integrated circuit formed on the second semiconductor substrate; and
segmented magnetic cores formed above the integrated circuit and oriented orthogonally to the package substrate.

46. The integrated fluxgate device of claim 45, wherein the segmented magnetic cores function as an aggregated magnetic core when electromagnetic coupling is established.

47. The integrated fluxgate device of claim 45, wherein the second integrated fluxgate die includes a contiguous coil encompassing a coil segment of each of the segmented magnetic cores.

48. The integrated fluxgate device of claim 45, wherein the segmented magnetic cores are electrically coupled together in series.

49. An electromagnetic sensing device, comprising:

a package substrate;

a first die mounted on the package substrate, the first die including:
an integrated circuit; and
a magnetic core formed above the integrated circuit, and having a sensing axis parallel to the package substrate; and a second die mounted on the package substrate, the second die including:
an integrated circuit; and
segmented magnetic cores formed above the integrated circuit, and having a sensing axis orthogonal to the package substrate.

50. The electromagnetic sensing device of claim 49, wherein the segmented magnetic cores function as an aggregated magnetic core when electromagnetic coupling is established.

51. The electromagnetic sensing device of claim 49, wherein the second integrated fluxgate die includes a contiguous coil encompassing a coil segment of each of the segmented magnetic cores.

52. The electromagnetic sensing device of claim 49, wherein the segmented magnetic cores are electrically coupled together in series.

\* \* \* \* \*